United States Patent

Naruse et al.

[11] Patent Number: 5,838,070
[45] Date of Patent: Nov. 17, 1998

[54] APPARATUS HAVING A SUBSTRATE AND ELECTRONIC CIRCUIT SOLDER-CONNECTED WITH THE SUBSTRATE

[75] Inventors: Toshimichi Naruse, Oura-gun; Noriaki Sakamoto, Yamada-gun, both of Japan

[73] Assignee: Sanyo Electric Co., Ltd., Osaka, Japan

[21] Appl. No.: 770,406

[22] Filed: Dec. 20, 1996

[30] Foreign Application Priority Data

Dec. 28, 1995 [JP] Japan ................................. 7-343404
Apr. 26, 1996 [JP] Japan ................................. 8-107810

[51] Int. Cl.⁶ .......................... H01L 23/48; H01L 23/52
[52] U.S. Cl. .......................... 257/779; 257/693; 257/786; 361/743; 361/768; 361/772
[58] Field of Search ................................. 257/692, 693, 257/779, 786; 361/743, 767, 768, 772

[56] References Cited

U.S. PATENT DOCUMENTS

| | | | |
|---|---|---|---|
| 4,673,967 | 6/1987 | Hingorany | 257/779 |
| 5,239,198 | 8/1993 | Lin et al. | 257/779 |
| 5,311,399 | 5/1994 | Zell et al. | 257/779 |
| 5,338,974 | 8/1994 | Wisherd et al. | 257/692 |
| 5,532,910 | 7/1996 | Suzuki et al. | 257/693 |
| 5,548,087 | 8/1996 | Dahringer | 257/692 |
| 5,621,619 | 4/1997 | Seffernick et al. | 257/693 |

OTHER PUBLICATIONS

"Eutectic Solder Preform for Solder Ball Connected Card Repairs" IBM Tech. Disc. Bulletin, vol. 37 No. 02b pp. 337–338, Feb. 1994.

*Primary Examiner*—David Ostrowski
*Attorney, Agent, or Firm*—Loeb & Loeb LLP

[57] ABSTRACT

An electronic circuit apparatus has first and second pad electrodes arranged on a substrate to be separated by a first interval, first and second chip electrodes to be separated by a second interval smaller than the first interval, a first solder for fixedly attaching the first chip electrode to the first pad electrode and a second solder for fixedly attaching the second chip electrode to the second pad electrode. Because the first interval is longer than the second interval, any constricted portion does not exist in each of the first and second solders. Therefore, because any stress is not concentrated on any portion of each of the first and second solders, the occurrence of a crack in each of the first and second solders can be prevented.

20 Claims, 10 Drawing Sheets

1 : 6 ~ 4.5 x $10^2$ N / $mm^2$
2 : 4.5 ~ 2.6 x $10^2$ N / $mm^2$
3 : 2.6 ~ 2.0 x $10^2$ N / $mm^2$
4 : 2.0 ~ 1.6 x $10^2$ N / $mm^2$
5 : 1.6 ~ 1.0 x $10^2$ N / $mm^2$

1 : 3.4 ~ 2.7 x $10^2$ N/$mm^2$

2 : 2.7 ~ 2.4 x $10^2$ N/$mm^2$

3 : 2.4 ~ 1.7 x $10^2$ N/$mm^2$

4 : 1.7 ~ 1.4 x $10^2$ N/$mm^2$

5 : 1.4 ~ 1.0 x $10^2$ N/$mm^2$

1: $3.4 \sim 2.5 \times 10^2$ N/mm²
2: $2.5 \sim 2.2 \times 10^2$ N/mm²
3: $2.2 \sim 1.6 \times 10^2$ N/mm²
4: $1.6 \sim 1.3 \times 10^2$ N/mm²
5: $1.3 \sim 0.9 \times 10^2$ N/mm²

APPARATUS HAVING A SUBSTRATE AND ELECTRONIC CIRCUIT SOLDER-CONNECTED WITH THE SUBSTRATE

BACKGROUND OF THE INVENTION

1. Field of the Invention

The present invention relates generally to an electronic circuit apparatus in which a device having an electrode terminal is solder-connected with an electrode wiring arranged on a substrate, and more particularly to an electronic circuit apparatus in which the occurrence of a crack in a soldered portion is prevented.

2. Description of the Prior Art

In the manufacturing of a hybrid integrated circuit (IC), a passive device such as a chip resistor, a chip capacitor or the like and an active device such as a transistor, an IC, a large scale integrated circuit (LSI) or the like are generally soldered to a print substrate or an insulating sheet on which one or more wirings including a pad electrode are arranged. The passive device and the active device are called a circuit device in this application hereinafter.

A general configuration of a substrate and a circuit device arranged on the substrate is disclosed in a patent gazette No. H8-28562 (1996). In this patent gazette, a method for preventing that a solder is melted and flows out from a prescribed region is described, and a configuration that a chip capacitor is attached on a substrate is disclosed. A cross sectional view of the configuration is shown on the right side in FIG. 3, and a plan view of the configuration is shown on the right side in FIG. 4. Hereinafter, the configuration is described with reference to FIGS. 3 and 4.

In the patent gazette, as shown on the right side in FIG. 3, a wiring 13 is arranged on a substrate 1 made of alumina ceramics, a pad electrode made of gold (Au) fixative to a solder is patterned on the uppermost layer of the wiring 13, an electronic element (or an electronic device) having the pad electrode of Au and a pair of electrodes 6 and 7 is soldered to the wiring 13, and the electronic element and the wiring 13 are electrically connected with each other.

In an electronic circuit apparatus having the above configuration in which the electronic device is fixedly connected with the substrate through a solder, a problem that a crack occurs in the solder becomes more and more marked.

Also, as an electrode or lead attached to a circuit device is downsized, it is required that a pad electrode of a wiring of a substrate is moreover downsized. A coefficient of thermal expansion in a chip resistor of the circuit device is $7*10^{-6°}$ C.$^{-1}$, and a coefficient of thermal expansion in a chip capacitor of the circuit device is ranged from $10*10^{-6°}$ to $11*10^{-6°}$ C.$^{-1}$. Also, a coefficient of thermal expansion in an alumina substrate is $23*10^{-6°}$ C.$^{-1}$, and a coefficient of thermal expansion in a print substrate is about $20*10^{-6°}$ C.$^{-1}$.

Because the coefficient of thermal expansion in the electronic device differs from that in the substrate, in cases where the electrode or lead of the electronic device is fixedly connected with the pad electrode of the substrate through a solder, a stress is generated in the solder connecting the electrode or lead of the electronic device and the pad electrode of the substrate because of a difference in the coefficient of thermal expansion between the circuit device and the substrate, a distortion occurs in the solder, and there is a problem that a crack occurs in the solder. That is, when the distortion occurs in the solder, Sn and Pb included in the solder are separated from each other, so that the crack occurs in the solder.

Because the electronic device is downsized, the adverse influence of the crack on the connection between the electronic device and the substrate cannot be disregarded, the occurrence of the crack in the solder cannot be prevented in the prior art.

SUMMARY OF THE INVENTION

A first object of the present invention is to provide, with due consideration to the drawbacks of such a conventional electronic circuit apparatus, an electronic circuit apparatus in which the occurrence of a crack in a solder through which an electronic device is connected with a substrate is prevented even though the electronic device is downsized.

A second object of the present invention is to provide an electronic circuit apparatus in which a positional difference between an electronic device and a substrate is corrected not to generate a crack in a solder through which the electronic device is connected with the substrate even though the positional difference exists when the electronic device is fixedly attached to the substrate.

The first object is achieved by the provision of an electronic circuit apparatus according to the present invention, comprising:

a first pad electrode arranged on a main surface of a substrate;

a second pad electrode arranged on the main surface of the substrate on condition that the first and second pad electrodes are separated by a first interval;

a first chip electrode fixedly attached to the first pad electrode through a first solder;

a second chip electrode fixedly attached to the second pad electrode through a second solder on condition that the first and second chip electrodes are separated by a second interval, the first interval being longer than the second interval.

In the above configuration, because the first interval is longer than the second interval, any constricted portion does not exist in a solder composed of the first solder and the second solder. Therefore, because any stress is not concentrated on any portion of the solder, the occurrence of a crack in the solder can be prevented.

Also, the first interval is an interval between a corner portion of a first outside end portion of the first pad electrode and a corner portion of a second outside end portion of the second pad electrode, and the second interval is an interval between a corner portion of a first inside end portion of the first chip electrode and a corner portion of a second inside end portion of the second chip electrode. In this case, because there is a high probability that a crack occurs in a portion of the solder contacting with the corner portion of the first outside end portion of the first pad electrode or a portion of the solder contacting with the corner portion of the second outside end portion of the second pad electrode, the occurrence of a crack in the solder can be reliably prevented.

To achieve the second object, it is preferred that each of the first and second pad electrodes of the above electronic circuit apparatus be shaped to make widths of a pair of opposite portions of the first and second pad electrodes narrower as the opposite portions are separated in outside directions of the first and second pad electrodes. For example, each of the first and second pad electrodes is shaped like the home base in a baseball or is shaped in a circular arc in which a part of a circle is cut off by a straight line.

In the above configuration, a melted solder is put on each of the first and second pad electrodes, and the first and second chip electrodes are arranged on the first and second pad electrodes through the melted solder to fixedly attach the first and second chip electrodes to the first and second pad electrodes. At this time, even though there is a positional difference between the first pad electrode and the first chip electrode or a positional difference between the second pad electrode and the second chip electrode, the first or second chip electrode is moved to correct the positional difference.

Therefore, an extreme positional difference can be prevented, and the extreme positional difference is corrected to a small positional difference to prevent the occurrence of a crack in the solder.

DESCRIPTION OF THE PREFERRED EMBODIMENTS

Preferred embodiments of an electronic circuit apparatus according to the present invention are described with reference to drawings.

(First Embodiment)

The reason of the occurrence of a crack in a solder used for an electronic circuit apparatus is examined and made clear by the inventors of the present invention. Therefore, the reason of the occurrence of a crack is initially described before the explanation of the embodiment.

Figure 2:
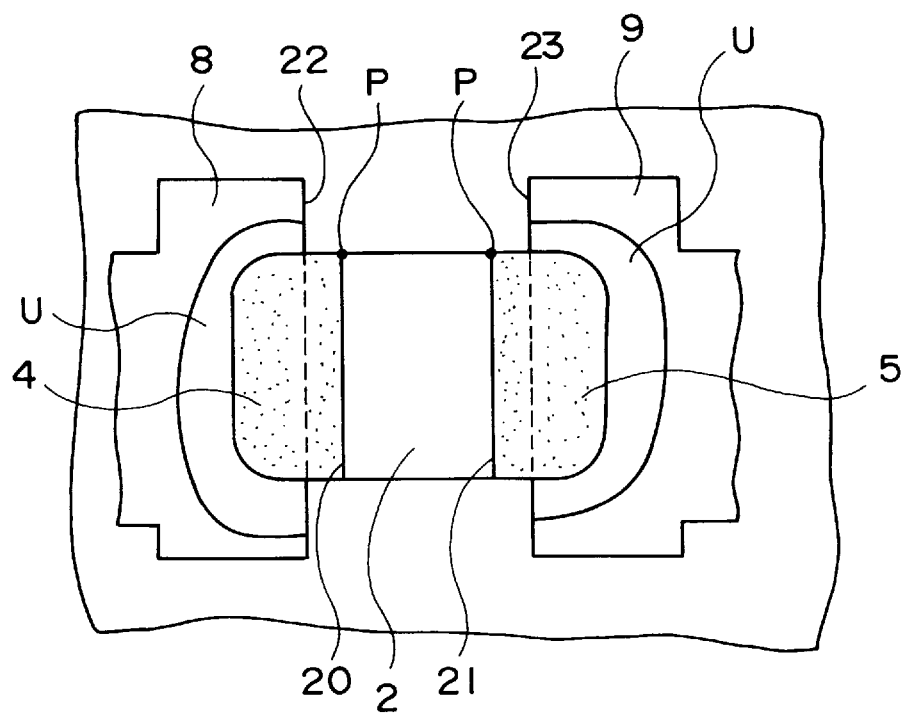
FIG. 2 is a plan view of the electronic circuit apparatus shown in FIG. 1.

As shown in FIG. 2, the inventors of the present invention examine a chip resistor and a chip capacitor functioning as a circuit device. An electrode is attached to each of both ends of the circuit device.

Figure 4:
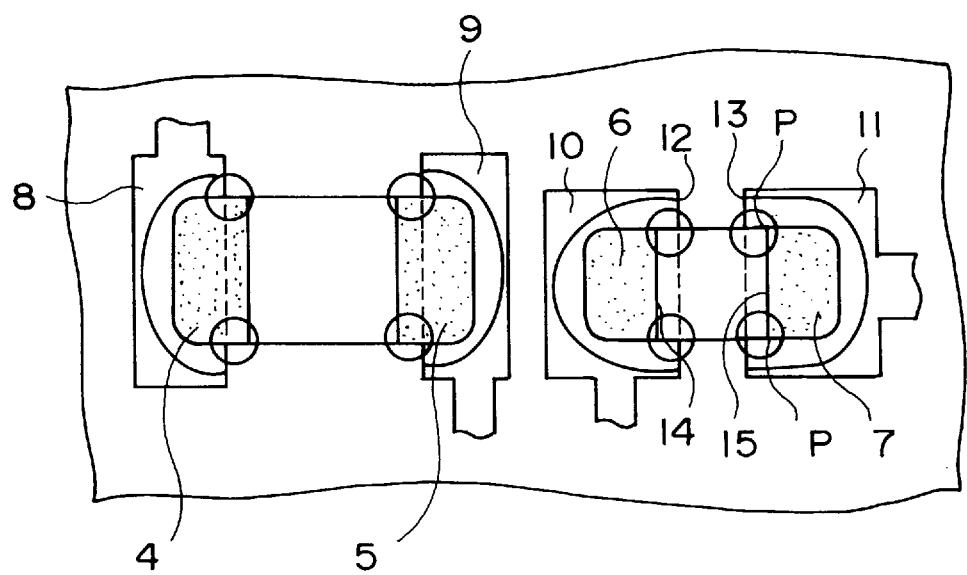
FIG. 4 is a plan view of the electronic circuit apparatuses shown in FIG. 3.

As a conventional electronic circuit apparatus is shown on the right side of FIG. 4, an interval between inside end portions 12 and 13 of a pair of pad electrodes 10 and 11 is set to be smaller than an interval between inside end portions 14 and 15 of a pair of chip electrodes 6 and 7 for the purpose of setting a margin for a positional difference inevitable in some degree in the arrangement of the chip electrodes 6 and 7 while considering an accuracy of an automatic setting apparatus. Therefore, even though the position of the chip electrode 6 or 7 shifts in an opposite direction from one pad electrode to another (or a horizontal direction in FIG. 4), each of the chip electrodes overlaps with one pad electrode, and each of the chip electrodes can contact with one pad electrode.

Here, as shown on the right side of FIG. 4, the inside end portions 12 and 13 of the pad electrodes 10 and 11 denote one end portion of the pad electrode 10 and one end portion of the pad electrode 11 opposite to each other. Also, the inside end portions 14 and 15 of the chip electrodes 6 and 7 denote one end portion of the chip electrode 6 and one end portion of the chip electrode 7 opposite to each other.

Figure 3:
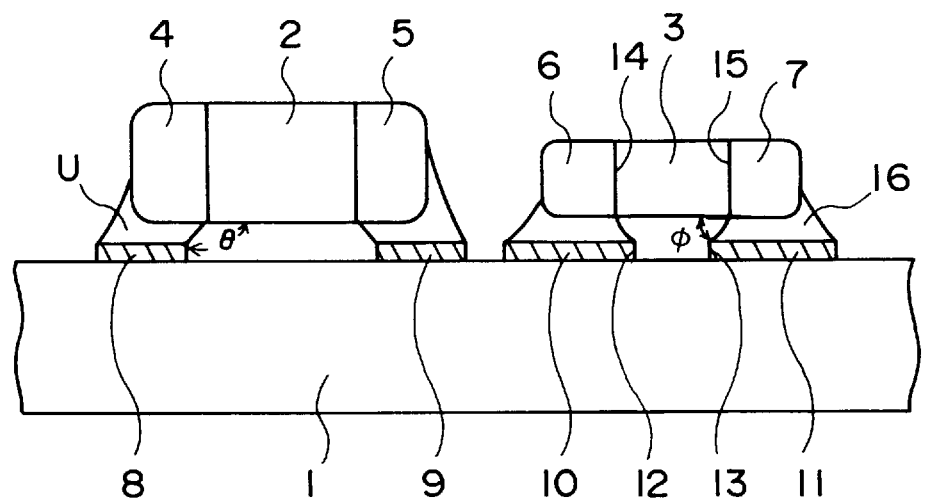
FIG. 3 is a cross sectional view of an electronic circuit apparatus according to the present invention and a conventional electronic circuit apparatus to compare the electronic circuit apparatuses.

Therefore, as shown on the right side of FIG. 3, an angle φ (between a ridgeline of a solder 16 extending from each of the inside end portions 12 and 13 of the pad electrodes 10 and 11 to one of the chip electrodes 6 and 7 and a ridgeline of a bottom surface of a chip 3 having the chip electrodes 6 and 7 is an acute angle. Therefore, a concave portion surrounded by a surface extending from one of the inside end portions 12 and 13 of the pad electrodes 10 and 11 to one of the inside end portions 14 and 15 of the chip electrodes 6 and 7 is generated at both end of the chip 3, so that a constricted portion is generated in each solder 16.

In a practical examination, because the ridgeline of extending from each of the inside end portions 12 and 13 of the pad electrodes 10 and 11 to one of the chip electrodes 6 and 7 is curved, a straight line approximate to the curved ridgeline is determined, and an angle between the straight line and the ridgeline of the bottom surface of the chip 3 is adopted as the angle φ.

In general, a physical strength at a constricted portion is weak. Therefore, a crack easily occurs in the constricted portion of the solder 16, and the crack grows. Therefore, the inventors of the present invention ascertain that a stress is easily concentrated on a portion of the solder 16 surrounded by each of circles shown in FIG. 4 (or each of points P shown in FIG. 2).

Thereafter, the inventors of the present invention perform a heat cycle reliability experiment for a sample having a constricted portion and a sample having no constricted portion. As shown in FIG. 3, various electronic devices are arranged on a substrate 1 in each of the samples. In the heat cycle reliability experiment, each sample is repeatedly heated and cooled, and various characteristic experiments are performed. In this embodiment, a crack occurring condition of the solder is examined.

As shown in FIG. 3, a large number of chip capacitors are arranged on the substrate 1. A chip capacitor of C2125 attached to the substrate 1 as shown on the left side of FIG. 3 is representatively described as the sample having no constricted portion, and a chip capacitor of C1608 attached to the substrate 1 as shown on the right side of FIG. 3 is representatively described as the sample having a pair of constricted portions.

The chip capacitor of C2125 is indicated by a reference numeral 2, and the chip capacitor of C1608 is indicated by a reference numeral 3. Here, a number 2125 denotes a size (a length of 2 mm and a width of 1.25 mm) of the chip capacitor, and a number 1608 denotes a size (a length of 1.6 mm and a width of 0.8 mm) of the chip capacitor. Also, a thickness of a chip capacitor generally depends on its capacitance. The chip capacitor of C1608 has a thickness of 0.7 mm and a volume of 0.896 mm , and the chip capacitor of C2125 has a thickness of 1.15 mm and a volume of 2.875 $mm^3$. Therefore, the size of the chip capacitor C2125 is about 3.2 times as large as that of the chip capacitor C1608.

Also, in cases where an angle between a ridgeline of a solder and a ridgeline of a bottom surface of a chip capacitor is an acute angle lower than 90 degree, the solder fixedly attached to the chip capacitor has a constricted portion. Therefore, the solder for the chip capacitor 2 has no constricted portion because the angle $\phi$ is an obtuse angle, and the solder for the chip capacitor 3 has a constricted portion because the angle $\phi$ is an acute angle.

Because the size of the chip capacitor C2125 is larger than that of the chip capacitor C1608, it is expected that the occurrence of a crack in the solder for the chip capacitor C2125 is earlier than that in the solder for the chip capacitor C1608. However, as a comparison result between the chip capacitor C2125 and the chip capacitor C1608, the occurrence of a crack in the solder for the chip capacitor C1608 is earlier than that in the solder for the chip capacitor C2125, and the crack occurring in the solder for the chip capacitor C1608 rapidly grows. Therefore, it is ascertained that the heat cycle reliability for the chip capacitor C2125 is superior to that for the chip capacitor C1608.

Accordingly, in cases where a chip capacitor is arranged on the substrate 1 to set an angle between a ridgeline of a solder and a ridgeline of a bottom surface of the chip capacitor to an obtuse angle, it is expected that the occurrence of a crack in the solder can be prevented. To ascertain this expectation, the inventors of the present invention analyzes a stress distribution in the neighborhood of the solder in more detail.

Figure 8:
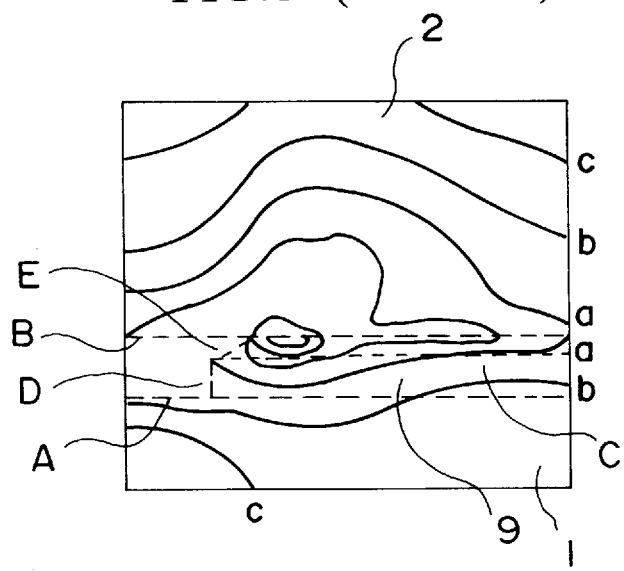
FIG. 8 is an explanatory view of stress occurring in a solder used in a conventional chip structure.
Figure 9:
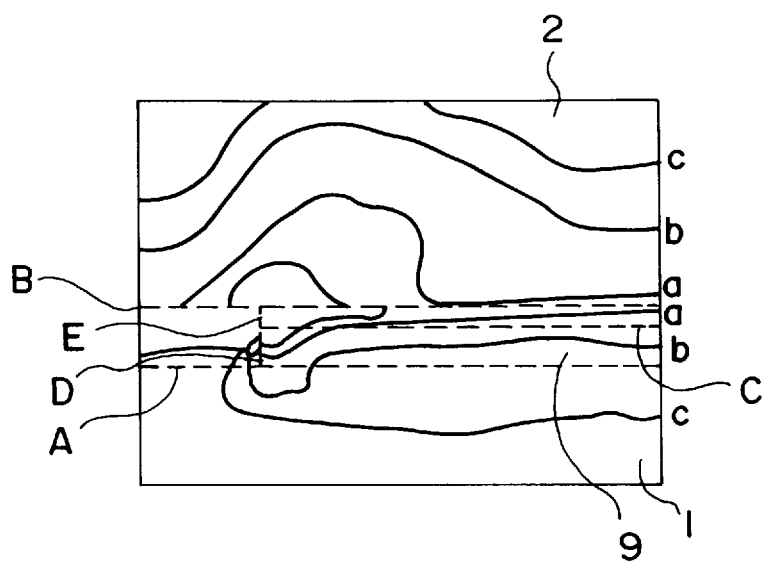
FIG. 9 is an explanatory view of a stress distribution in cases where an extending plane of the solder is perpendicular.
Figure 10:
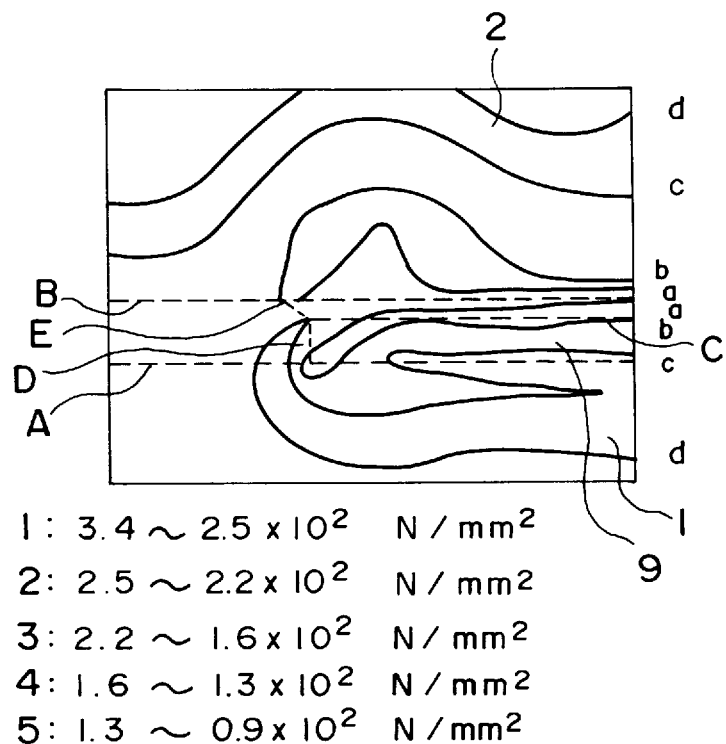
FIG. 10 is an explanatory view of a stress distribution of a solder according to the present invention.

Hereinafter, an analyzing result is described with reference to FIGS. 8 to 10. Each of FIGS. 8 to 10 is an enlarged side view of the substrate 1, the pad electrode 9, the solder 16 and the chip electrode 5 of the chip capacitor 2 and shows a stress distribution at these devices. A plurality of dotted lines indicate a connecting structure of the chip 2 and the substrate 1 through the solder 16, the substrate 1 is placed below the dotted line A, the dotted line B indicates the bottom surface of the chip 2, the dotted line C indicates an upper surface of the pad electrode 9, the dotted line D indicates the inside end side (23 in FIG. 1) of the pad electrode 9, and the dotted line E indicates an extending surface portion of the solder.

FIG. 8 shows an analyzing result of a stress distribution for a conventional electronic circuit apparatus in which a portion constricted in the right direction exists in the solder because of an acute angle between the extending plane of the solder and the bottom surface of the chip, and this stress distribution shown in FIG. 8 is called a constriction type. FIG. 10 shows an analyzing result of a stress distribution for an electronic circuit apparatus in which an angle between the extending plane of the solder and the bottom surface of the chip is an obtuse angle, and this stress distribution shown in FIG. 10 is called a taper type. FIG. 9 shows an analyzing result of a stress distribution for an electronic circuit apparatus in which an angle between the extending plane of the solder and the bottom surface of the chip is 90 degrees, and this stress distribution shown in FIG. 9 is called a straight type. In the straight type stress distribution, because it is required that the inside end portion 21 of the chip electrode 5 perfectly agrees with the inside end portion 23 of the pad electrode 9, a positioning accuracy for the chip electrode 5 and the pad electrode 9 is strictly required. Therefore, the straight type stress distribution cannot be obtained in a mass production for the electronic circuit apparatus. In addition, a plurality of stress values are written below each of the stress distributions of FIGS. 8 to 10, a first stress value (for example, from $6*10^2$ $N/mm^2$ to $4.5*10^2$ $N/mm^2$ in FIG. 8) denotes a value at a region surrounded by the innermost solid line, a second stress value (for example, from $4.5*10^2$ $N/mm^2$ to $2.6*10^2$ $N/mm^2$ in FIG. 8) denotes a value at a region surrounded by the innermost solid line and the second inner solid line), a third stress value (for example, from $2.6*10^2$ $N/mm^2$ to $2.0*10^2$ $N/mm^2$ in FIG. 8) denotes a value at a region surrounded by the second inner solid line and the third inner solid line), and a fourth stress value (for example, from $2.0*10^2$ $N/mm^2$ to $1.6*10^2$ $N/mm^2$ in FIG. 8) denotes a value at a region surrounded by the third inner solid line and the fourth inner solid line.

In cases where three regions in FIGS. 8 to 10 respectively surrounded by the innermost solid line are compared with each other, the region of the taper type shown in FIG. 10 is largest, and a stress value in the region shown in FIG. 10 is in a range from 340 to 250 $N/mm^2$. In contrast, a stress value in the region of the constriction type shown in FIG. 8 is in a range from 600 to 450. Therefore, the stress of which the value is two times as high as that in the taper type is distributed in the narrow region of the constriction type shown in FIG. 8, and the stress of which the value is a half of that in the constriction type is distributed in the wide region of the taper type shown in FIG. 10. That is, the stress in the taper type is not concentrated on a region and is dispersed as compared with the stress in the constriction type. Also, it is ascertained that the stress in the taper type is reduced to about ⅔ or ½ according to a calculation result as compared with the stress in the constriction type.

As is described above, it is ascertained that the occurrence of a crack in the solder can be prevented by manufacturing an electronic circuit apparatus having a specific configuration in which any constricted portion is not generated in the solder and the stress distribution is the taper type. In following embodiments of the present invention, an electronic circuit apparatus having the specific configuration is adopted, and the occurrence of a crack in the solder is prevented.

An electronic circuit apparatus having the specific configuration according to the first embodiment is described.

Figure 1:
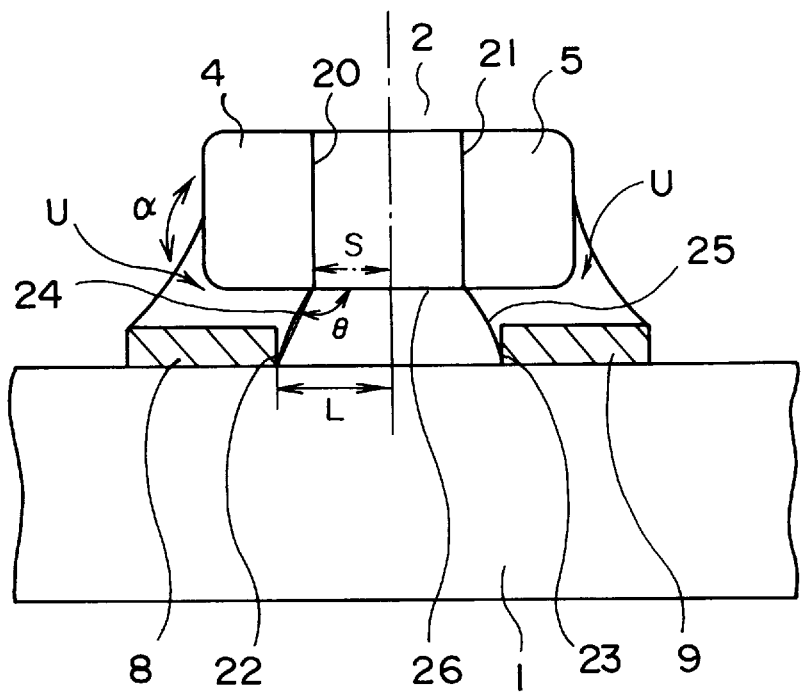
FIG. 1 is a cross sectional view of an electronic circuit apparatus explaining embodiments of the present invention.

As shown in FIGS. 1 and 2, in an electronic circuit apparatus according to the first embodiment, an oxide film is formed on a surface of a metallic substrate 1 made of aluminum, an upper surface of the oxide film is coated with an insulating resin film, and a conductive means such as a conductive line, a conductive land or the like is stuck on the insulating resin film. That is, a first pad electrode 8 and a second electrode 9 placed on the substrate 1 are separated by a distance 2L, and a chip 2 is fixedly attached to the first and second pad electrodes 8 and 9 through a solder U. The chip 2 is a chip capacitor shaped in a rectangular prism, a first chip electrode 4 and a second chip electrode 5 are connected with both ends of the chip 2, and the first and second chip electrodes 4 and 5 are separated by a distance 2S.

An alumite processing is performed for both surface of the oxide film according to an anodic oxidation. However, it is applicable that the alumite processing be performed according to a thermal oxidation or a deposition. Also, insulating resin having an adhesive property such as epoxy resin or the like is used as the insulating resin film.

In addition, the conductive means is stuck on the insulating resin film according to a hot press method. This conductive means is made of copper (Cu). After the conductive means is stuck on the entire surface of the insulating resin film, the conductive means is etched by using a solution of ferric chloride or the like and is patterned. Also, the conductive land is an area in which a bear chip type semiconductor device is fixedly attached to the conductive means. In this embodiment, because a heater device for a large signal is fixedly attached to the conductive means as the semiconductor device, a heat sink made of Cu is arranged at a lower layer of the chip 2 and is fixedly attached to the conductive land through a solder or the like. Therefore, the conductive land is integrally formed with the conductive line or is formed in an island shape.

The feature of the present invention is a positional relationship between a group of the first and second pad electrodes 8 and 9 and a group of the first and second chip electrodes 4 and 5, the interval 2L between a pair of inside end portions 22 and 23 of the first and second pad electrodes 8 and 9 is longer than the interval 2S between a pair of inside end portions 20 and 21 of the first and second chip electrodes 4 and 5. That is, a distance L from the center of the chip 2 to the inside end portion 22 or 23 of the first or second pad electrode 8 or 9 is set to be larger than a distance S from the center of the chip 2 to the inside end portion 20 or 21 of the first or second chip electrode 4 or 5, and the distance L is set to be smaller than a distance from the center of the chip 2 to an outside end portion of the first or second chip electrode 4 or 5. Here, the outside end portion of the first or second chip electrode 4 or 5 denotes an end portion opposite to the inside end portion 20 or 21 through the first or second chip electrode 4 or 5.

Also, as shown in FIG. 2, it is preferred that an area occupied by the pad electrode 8 or 9 on the substrate 1 be larger than an area occupied by the chip electrode 4 or 5 on the substrate 1 in cases where the electronic circuit apparatus is viewed from its upper side. In this case, solder is put on a major part of the area of each pad electrode on condition that an area occupied by the solder on each pad electrode is larger than the area occupied by each of the chip electrodes 4 and 5 on the substrate 1, the chip 2 is set on the solder, and a solder fillet U is formed on each pad electrode by melting the solder. Because the solder fillet U has a sufficient thickness, the growth of a crack is prevented.

Because of the above feature, as is described hereinbefore, the occurrence of a crack in the solder can be prevented.

In this embodiment, a chip capacitor is used as the chip 2. However, it is applicable that an IC chip, an LSI chip, a power MOSFET chip, an IGBT chip or the like be used as the chip 2. In addition, in case of a bipolar type power transistor, a base electrode and an emitter electrode connected with an upper surface of the transistor are respectively wire-bonded with a pad integrally formed with a wiring of the insulating substrate 1 through a metallic thin line in the same manner as the connection in the chip 2. However, because a collector is connected with a reverse side of the transistor, each of the base and emitter electrodes is fixedly attached to a conductive land (placed on the metallic substrate side) integrally formed with the conductive line. In addition, a passive device such as a chip resistor, a chip capacitor or the like is connected with the pad electrodes 8 and 9 functioning as a part of the conductive line through solder.

Accordingly, when the melted solder placed between the electrodes 4 and 8 is solidified, an angle φ between an extending plane of the solidified solder and the bottom surface of the chip 2 becomes an obtuse angle. Also, an angle α between the extending plane of the solidified solder and the side surface of the chip 2 becomes an obtuse angle.

As is described before, a stress in each of the regions indicated by the circles is dispersed because of the obtuse angle φ, and the occurrence of a crack in the solder can be prevented.

Also, in case of a multi-layer wiring substrate, a conductive land or a wiring of a chip planned to be stuck to an upper layer of a substrate is arranged in a region in which a flexible substrate or another substrate is planned to be stuck to the uppermost layer. Also, a chip resistor, a print resister, a chip capacitor and the like are electrically fixed to a conductive line of the multi-layer wiring substrate. Also, an upper layer semiconductor device such as a transistor is fixedly attached to an upper layer conductive land. Because a circuit device placed on the upper layer of the substrate has the same configuration as that shown in FIG. 1, the occurrence of a crack in a solder used to stick the circuit device to the substrate can be prevented.

In this case, an electric contact between the metallic substrate 1 and a circuit placed on the upper layer of the substrate is achieved by an upper layer bonding pad arranged at the periphery of the upper layer of the substrate, a lower layer bonding pad arranged at an outer side of the periphery of the upper layer of the substrate and bonding wires connecting the upper layer bonding pad and the lower layer bonding pad by wire-bonding. However, it is applicable that the electric contact between the metallic substrate 1 and the circuit placed on the upper layer of the substrate be achieved by a conductive means exposed to an opening portion of the upper layer of the substrate and a conductive means arranged on the uppermost layer of the substrate on condition that the two conductive means are wire-bonded with each other.

However, in case of the wire-bonding, because the wire is curved, there is a problem that a height is required for the wire-bonding in some degree. Also, though one layer circuit is generally achieved by the substrate, a probability of the occurrence of a cross-over condition is increased as the circuit is complicated. The problem of the cross-over condition is solved by performing a jumping wire-bonding. However, as the number of jumping wire-bonding cases is increased, a multi-layer substrate and a via hole are required.

Finally, a lead is fixedly attached to the electronic circuit apparatus, the electronic circuit apparatus is enclosed in a metallic or resin case (not shown) or the electronic circuit apparatus is directly enclosed in resin. For example, a frame is prepared around the substrate, and the frame is filled with the resin to enclose the apparatus.

(Second Embodiment)

In the electronic circuit apparatus shown in FIG. 2, all regions of the inside end portions 22 and 23 of the first and second pad electrodes 8 and 9 are placed on the outer side than the inside end portions 20 and 21 of the first and second chip electrodes 4 and 5. However, a most stress concentrating position is each of the points indicated by the circles in FIG. 4. That is, each of the inside end portions 20 and 21 at the bottom surface of the chip 2 and a periphery of each of the first and second chip electrodes 4 and 5 at the bottom surface of the chip 2 cross each other at each of the points indicated by the circles, and a stress having the most high value is concentrated on each of the corner portions P placed at the inside end portions 20 and 21 of the first and second chip electrodes 4 and 5. Therefore, in cases where the inside end portions 22 and 23 of the first and second pad electrodes 8 and 9 are placed on the outer side than each of the corner portions P, the occurrence of a crack can be prevented in some degree.

Figure 11:
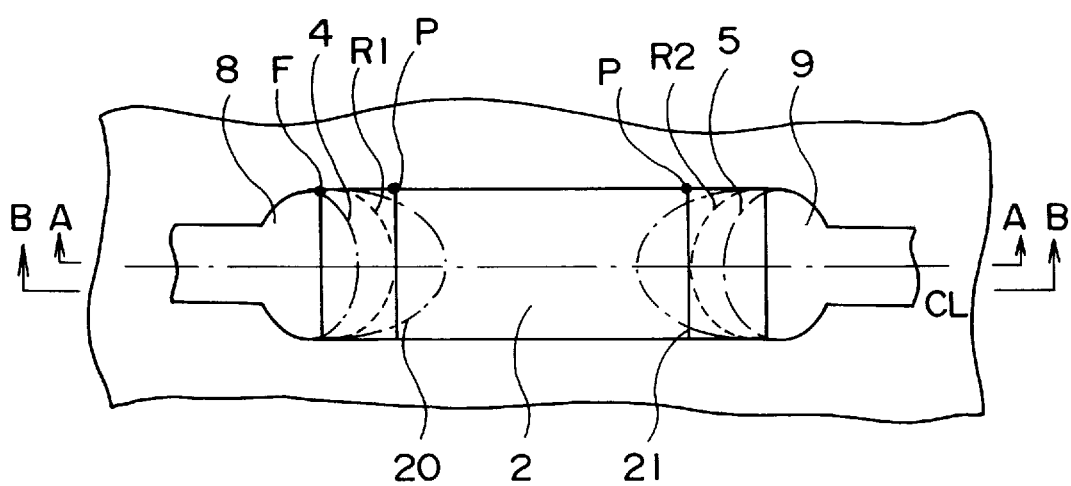
FIG. 11 is a plan view of an electronic circuit apparatus according to another embodiment of the present invention.
Figure 14:
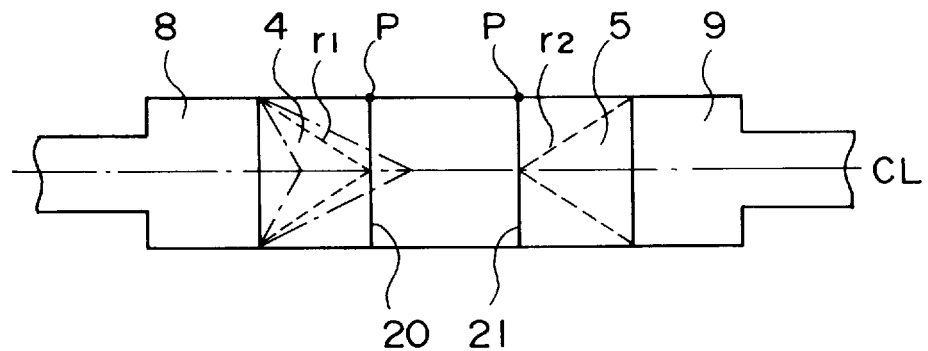
FIG. 14 is a plan view of an electronic circuit apparatus according to another embodiment of the present invention.
Figure 15:
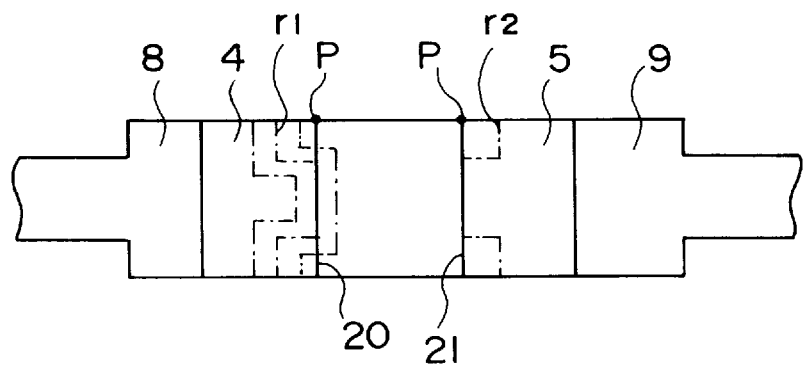
FIG. 15 is a plan view of an electronic circuit apparatus according to another embodiment of the present invention.

Therefore, as shown in each of FIGS. 11, 14 and 15, an electronic circuit apparatus in which the inside end portions 22 and 23 of the first and second pad electrodes 8 and 9 are placed on the outer side than each of the corner portions P is prepared.

In the electronic circuit apparatus according to the first embodiment, each of the pad electrodes 8 and 9 is formed in the rectangular shape, and the interval 2L between the inside end portions 22 and 23 of the first and second pad electrodes 8 and 9 is constant because the inside ends of the first and second pad electrodes 8 and 9 are linearly formed and are parallel to each other. However, in the second embodiment, as shown in each of FIGS. 11 and 14, end portions of the pad electrodes 8 and 9 opposite to each other are curved, each of the pad electrodes 8 and 9 is symmetric with respect to a central line CL for each of the pad electrodes 8 and 9, and an interval between the end portions of the pad electrodes 8 and 9 becomes larger as the end portions is far from the central line CL.

For example, as shown in FIG. 11, each of the inside ends R1 and R2 of the first and second pad electrodes 8 and 9 is not linearly formed but is formed in a circular arc shape or an oval arc. A minimum interval between the end portions R1 and R2 of the pad electrodes 8 and 9 on the central line CL is larger than the interval 2S between the inside end portions 20 and 21 of the bottom surface of the chip 2, as shown by dotted lines of FIG. 11. Also, a maximum interval between a first line segment orthogonally crossing with the central line CL on the first pad electrode 8 and passing a corner point F of FIG. 11 and a second line segment orthogonally crossing with the central line CL on the second pad electrode 9 is larger than the interval 2S between the inside end portions 20 and 21 of the bottom surface of the chip 2. Therefore, the occurrence of a crack in the solder can be moreover prevented as compared with in the first embodiment.

In the above configuration, the interval between the end portions R1 and R2 of the pad electrodes 8 and 9 is larger than the interval 2S between the inside end portions 20 and 21 of the bottom surface of the chip 2 over the entire end portions of the pad electrodes 8 and 9. However, because a stress having the most high value is concentrated on each of the corner portions P placed at the inside end portions 20 and 21 of the first and second chip electrodes 4 and 5 in the first embodiment to generate a crack at the corner portions P, as shown by dot-dash-lines of FIG. 11, even though a minimum interval between the end portions of the pad electrodes 8 and 9 on the central line CL is smaller than the interval 2S between the inside end portions 20 and 21 of the bottom surface of the chip 2, in cases where end portions of the pad electrodes 8 and 9 on a line connecting the two points P is larger than the interval 2S between the inside end portions 20 and 21 of the bottom surface of the chip 2, the occurrence of a crack in the solder can be moreover prevented as compared with in the first embodiment.

Figure 12:
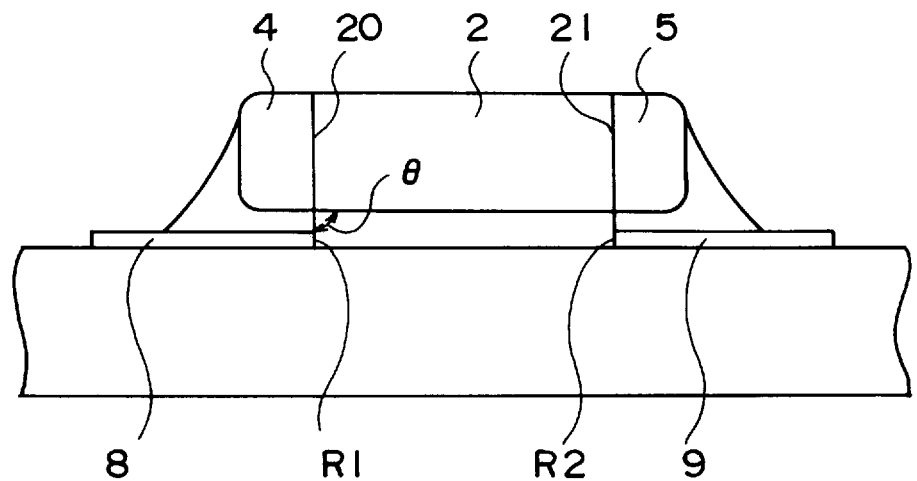
FIG. 12 is a cross sectional view taken generally along a line A—A of FIG. 11.
Figure 13:
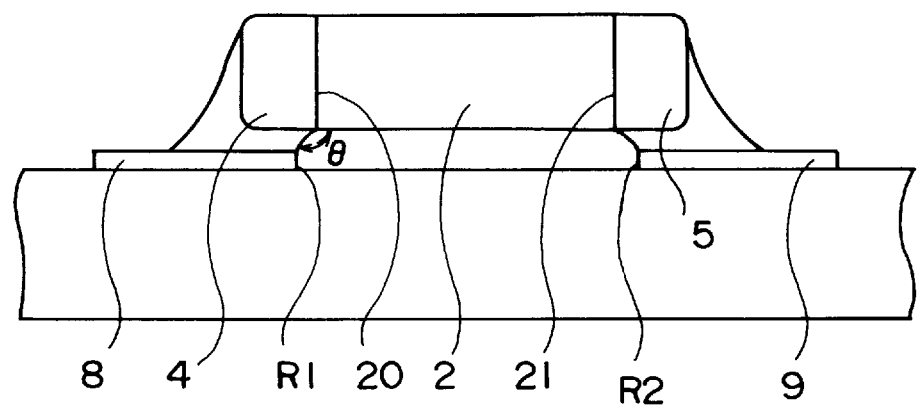
FIG. 13 is a cross sectional view taken generally along a line B—B of FIG. 11.

FIG. 12 is a cross sectional view taken generally along a line A—A of FIG. 11, and FIG. 13 is a cross sectional view taken generally along a line B—B of FIG. 11.

The angle φ is 90 degrees in FIG. 12 and is an obtuse angle in FIG. 13. Also, in cases where the end portions R1 and R2 of the pad electrodes 8 and 9 are placed outside the dotted lines shown in FIG. 11, because the angle φ becomes an obtuse angle over the entire periphery of each pad electrode, the occurrence of a crack in the solder can be moreover prevented as compared with in the first embodiment.

Also, as shown in FIG. 14, the end portions r1 and r2 of the pad electrodes 8 and 9 are respectively formed in a triangular shape, and a pair of vertexes of the triangular shaped end portions r1 and r2 of the pad electrodes 8 and 9 are placed on the central line CL. In this embodiment, the triangular shaped end portions r1 and r2 of the pad electrodes 8 and 9 are respectively indicated by a dotted line. However, it is applicable that the triangular shaped end portions of the pad electrodes 8 and 9 be respectively indicated by one of two dot-dashed lines. Even though the pad electrodes 8 and 9 in the electronic circuit apparatus have the triangular shaped end portions r1 and r2, the occurrence of a crack in the solder can be prevented in the same manner as the pad electrodes 8 and 9 in the electronic circuit apparatus shown in FIG. 11.

Also, as shown in FIG. 15, the end portions r1 and r2 of the pad electrodes 8 and 9 are respectively formed in a step shape as shown in a dotted line. Because a maximum stress concentrated on the solder is released in the electronic circuit apparatus shown in FIG. 15, the occurrence of a crack in the solder can be prevented in the same manner as the pad electrodes 8 and 9 in the electronic circuit apparatus shown in FIG. 11.

In addition, there is another feature in the electronic circuit apparatus shown in FIG. 11. That is, even though the position of the chip 2 shifts from a desired position on the pad electrodes 8 and 9 by a positional difference when the chip 2 is put on the pad electrodes 8, the chip 2 is automatically moved to the desired position according to a surface tension of the melted solder and is positioned at the desired position.

That is, to manufacture the electronic circuit apparatus shown in FIG. 11, the melted solder is put on the pad electrodes 8 and 9, the chip 2 is put on the melted solder, and the chip 2 is fixedly attached to the pad electrodes 8 and 9. Even though the position of the chip 2 shifts, for example, in the left direction in FIG. 11 on the pad electrodes 8 and 9 by a positional difference when the chip 2 is put on the melted solder, because each pad electrode is formed in the circular shape, and a width of the pad electrode 8 is narrowed from the corner point F toward the left direction. Therefore, even though the outer end of the chip electrode 4 of the chip 2 is initially put on a particular position shifting from the corner point F in the left direction by a particular positional difference, because any solder does not exist in the particular position, the chip 2 is automatically moved in the right direction according to the surface tension of the melted solder, the outer end of the chip electrode 4 of the chip 2 is placed at the corner point F, so that the particular positional difference is corrected.

Figure 16:
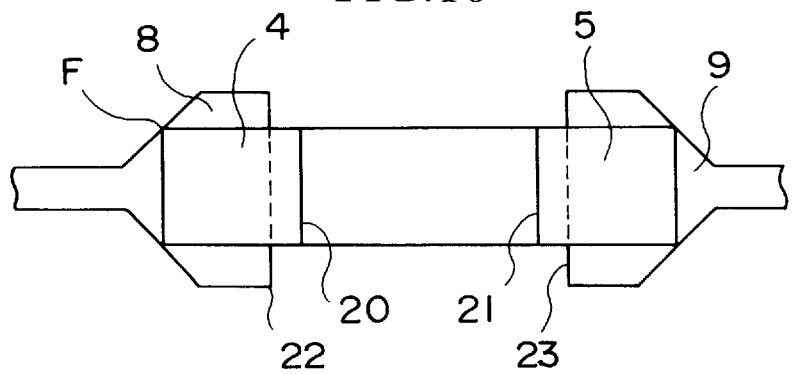
FIG. 16 is a plan view of an electronic circuit apparatus according to another embodiment of the present invention.
Figure 17:
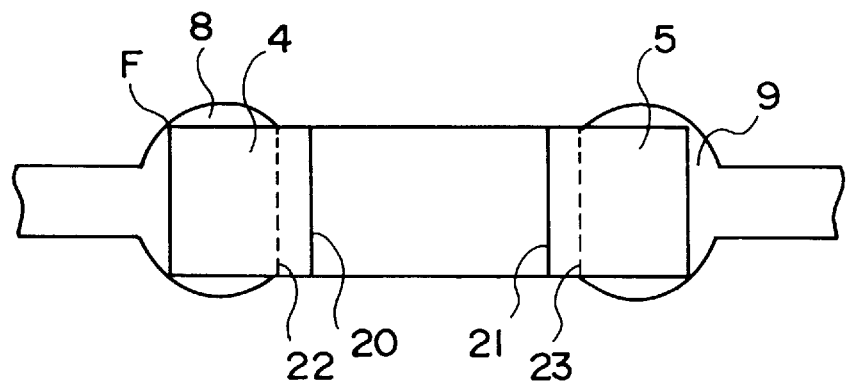
FIG. 17 is a plan view of an electronic circuit apparatus according to another embodiment of the present invention.
Figure 18:
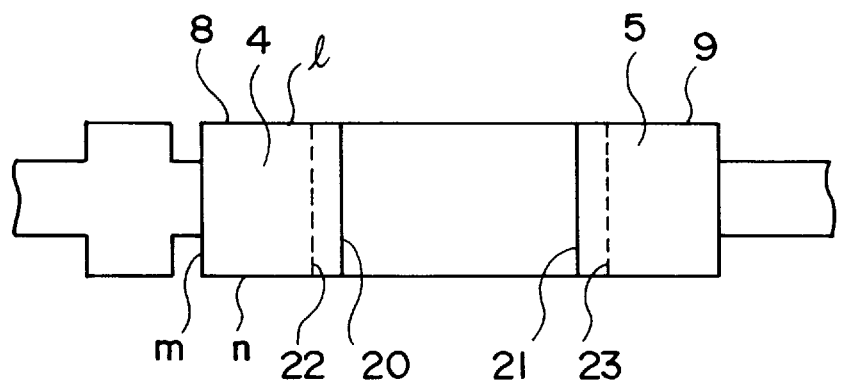
FIG. 18 is a plan view of an electronic circuit apparatus according to another embodiment of the present invention.

In the pad electrodes of the electronic circuit apparatus shown in each of FIGS. 16 to 18, even though the position of the chip 2 shifts from a desired position on the pad electrodes 8 and 9 by a positional difference when the chip 2 is put on the pad electrodes 8, the chip 2 is automatically moved to the desired position according to a surface tension of the melted solder and is positioned at the desired position. In FIG. 16, each of the pad electrodes 8 and 9 is formed in a shape like a home base in the baseball. In this electronic circuit apparatus, even though the outer end of the chip electrode 4 of the chip 2 is initially put on a particular position shifting from the corner point F in the left direction by a particular positional difference, the chip 2 is automatically moved in the right direction according to the surface tension of the melted solder, the outer end of the chip electrode 4 of the chip 2 is placed at the corner point F, so that the particular positional difference is corrected.

In FIG. 17, each of the pad electrodes 8 and 9 is formed in a circular arc obtained by straightly cutting a circle at a dotted line. A corner point F of the chip electrode 4 is placed on a periphery of the pad electrode 8.

In FIG. 18, three sides 1, m and n of each of the chip electrodes 4 and 5 are just placed on three sides of a head portion of one pad electrode. The pad electrode 8 additionally has a tail portion in which a width is changed, and the pad electrode 9 additionally has a tail portion in which a width is constant.

As is described above, the corner point F of the chip electrode is just placed on the side or periphery of the pad electrode in the electronic circuit apparatus shown in each of FIGS. 16 to 18. For example, even though the chip 2 is initially set at a particular position shifting from the corner point F in the left or right direction by a particular positional difference smaller than a half of an interval between the inside end 20 of the bottom surface of the chip 2 and the inside end 22 of the pad electrode 8, the angle φ between the extending plane of the solder and the bottom surface of the chip 2 becomes an obtuse angle, so that a margin for the arrangement of the chip 2 can be obtained, and a strict design accuracy is not required.

Therefore, even though the circuit device such as the chip 2 is initially set at a particular position shifting from a desired position, in cases where a width of each pad electrode is narrowed within a distance between the inside end portion of the circuit device electrode crossing with the bottom surface periphery of the circuit device and the inside end portion of the pad electrode to make the chip 2 cross the pad electrode, the chip 2 can be fixedly attached to the pad electrodes while maintaining the angle φ between the extending plane of the solder and the bottom surface of the chip 2 to an obtuse angle.

In the first and second embodiments, the aluminum substrate is used as an example of the substrate. However, the substrate is not limited to the aluminum substrate. For example, a ceramic substrate such as alumina or the like, a metallic substrate such as Cu or Fe, a flexible sheet or a print substrate can be useful as the substrate.

Also, in the first and second embodiments, the wiring is made of Cu. However, it is sufficient that the solder can stick to a surface of the wiring. Therefore, a wiring of which a surface is coated with Ni or Au, an Ni wiring or an Au wiring can be useful as the wiring.

Also, as shown in FIG. 2, in cases where the chip electrodes 4 and 5 are placed on both sides of the chip 2 opposite to each other or in the neighborhood of the both sides of the chip 2 and the chip electrodes 4 and 5 are separated by a prescribed interval, the chip 2 can be applied for the electronic circuit apparatus as the electronic circuit.

In particular, because the chip 2 is connected with the substrate 1 through the pad electrodes 8 and 9 and the solders, it is required that the chip electrodes 4 and 5 are placed on both end portions of the bottom surface of the chip 2. Also, five exposed surfaces in each of the chip electrodes 4 and 5 are plated with Au or solder. As shown in FIG. 2, the plated portions in each of the chip electrodes 4 and 5 are placed in one dotted area.

Figure 5:
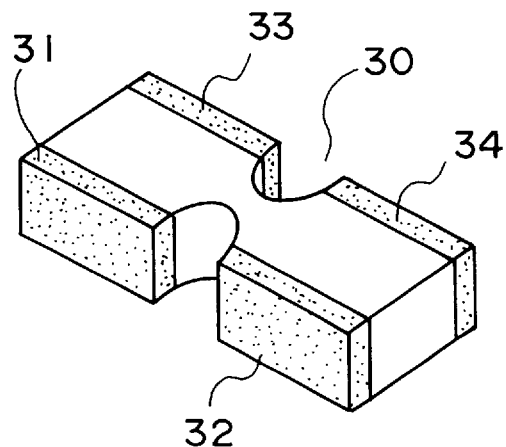
FIG. 5 is an oblique view of a chip capacitor applied for the present invention.

Another example of the chip is shown in FIG. 5. As shown in FIG. 5, a first pair of chip electrodes 31 and 33 and a second pair of chip electrodes 32 and 34 are placed on side end portions of a ceramic chip capacitor 30. Each of pairs of chip electrodes are opposite to each other through a body of the chip capacitor 30. Therefore, it is applicable that the passive device such as a chip capacitor, a chip resistor or a chip ceramic oscillator have one or more pairs of chip electrodes and each pair of chip electrodes be opposite to each other through a body of the passive device.

Figure 19:
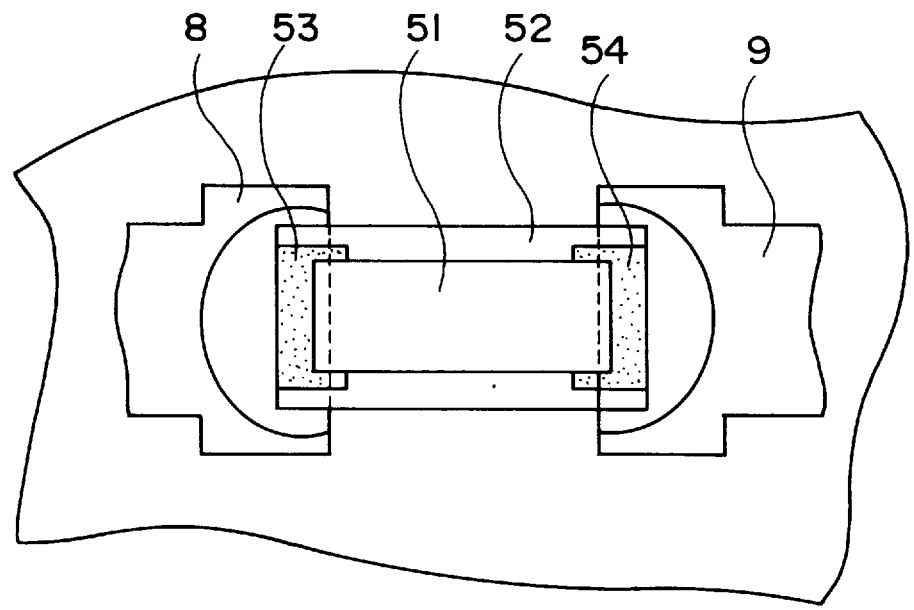
FIG. 19 is a plan view of a chip resistor used for the electronic circuit apparatus according to each embodiment of the present invention.
Figure 20:
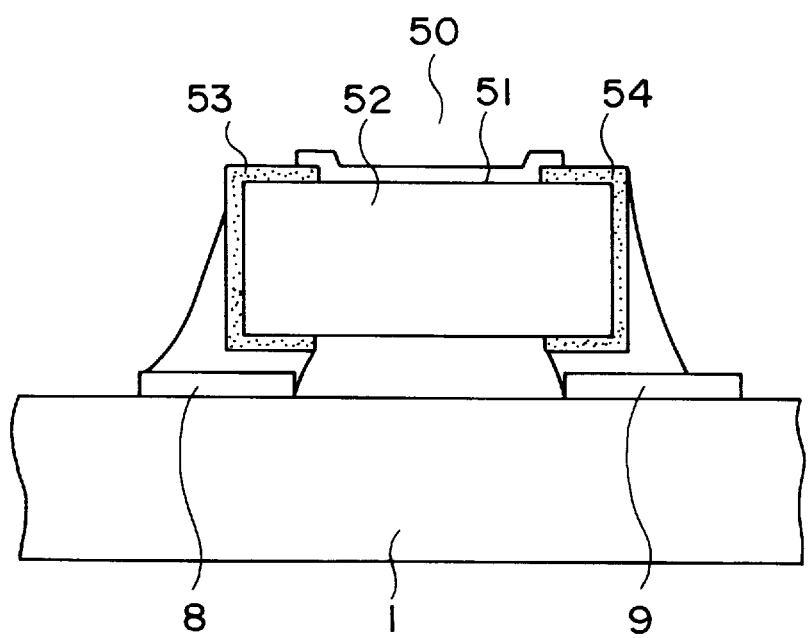
FIG. 20 is a cross sectional view of the chip resistor shown in FIG. 19.

Another example of the chip is shown in FIGS. 19 and 20. As a chip resistor 50 is shown in FIGS. 19 and 20, a pair of chip electrodes 53 and 54 are arranged on both side ends (right and left sides in FIG. 19) of a core substrate 52 placed in the longitudinal direction of the core substrate 52, and each of the chip electrodes 53 and 54 is not arranged on both other side ends (above and below sides in FIG. 19) of the core substrate 52 placed in the lateral direction of the core substrate 52. Also, a thick-film resistor 51 is arranged on an upper surface of the core substrate 52 to be electrically connected with the chip electrodes 53 and 54.

Figure 6:
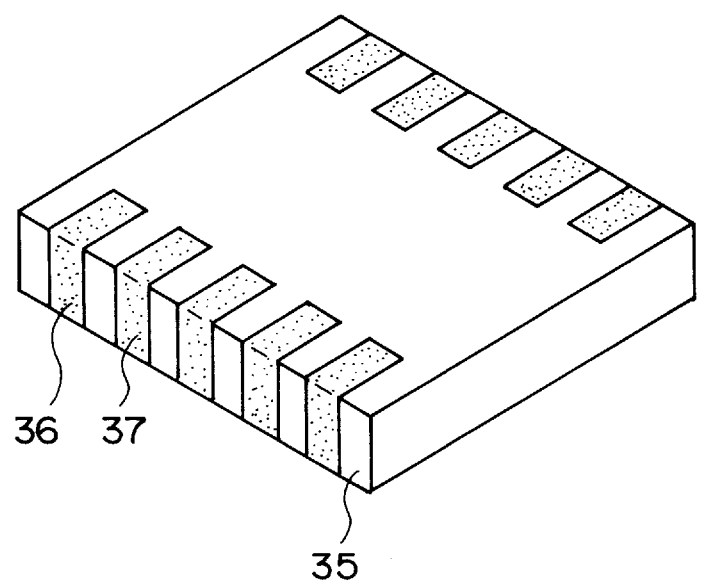
FIG. 6 is an oblique view of a semiconductor device or a passive device applied for the present invention.
Figure 7:
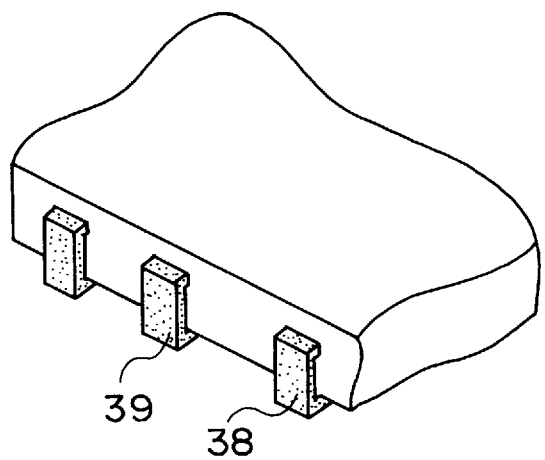
FIG. 7 is an oblique view of a plurality of leads used for the semiconductor device or the passive device shown in FIG. 6.

Also, another example of the passive device is shown in each of FIGS. 6 and 7. As shown in each of FIGS. 6 and 7, a plurality of pairs of chip electrodes are arranged on both side ends of the passive device. That is, as shown in FIG. 6, a plurality of pairs of leads 36 and 37 are connected to a passive device (or a transistor), and the passive device is enclosed with ceramic or resin to form an enclosing plane 35. This type of lead is called a leadless chip carrier (LCC). Also, as shown in FIG. 7, each of a plurality of lead frames 38 and 39 is projected from a passive device (or a transistor) and is bent in an lower direction to be attached to an enclosing plane. This type of lead is called a single outline J lead (SOJ).

In FIGS. 6 and 7, though the passive device having the plurality of pairs of chip electrodes are shown, it is applicable that an active device having a plurality of pairs of chip electrodes arranged on both side ends of the active device be used as the electronic circuit for the electronic circuit apparatus.

Also, in cases where a transistor formed in a rectangular prism shape is used as the electronic circuit for the electronic circuit apparatus, it is applicable that three pairs of chip electrodes be arranged on three side ends of the transistor.

Also, in cases where an IC formed in a rectangular prism shape is used as the electronic circuit for the electronic circuit apparatus, as shown in FIGS. 5 and 6, it is applicable that a plurality of pairs of chip electrodes be arranged on both side ends of the IC.

What is claimed is:

1. An electronic circuit apparatus, comprising:
   a first pad electrode arranged on a main surface of a substrate;
   a second pad electrode arranged on the main surface of the substrate so that the first and second pad electrodes are separated by a first interval, wherein the first interval is measured between an inside edge of the first pad electrode and an inside end of the second pad electrode;

a chip having a first chip electrode and a second chip electrode where the first and second chip electrodes are separated by a second interval, wherein the second interval is measured along a face of the chip between an inside edge of the first chip electrode and an inside edge of the second chip electrode, the first interval being longer than the second interval;

a first solder for fixedly attaching the first chip electrode to the first pad electrode; and a second solder for fixedly attaching the second chip electrode to the second pad electrode.

2. An electronic circuit apparatus according to claim 1 in which the chip has a rectangular prism shape, and the first and second chip electrodes are on ends of the chip opposite to each other.

3. An electronic circuit apparatus according to claim 1 in which the chip has a rectangular prism shape, the first and second chip electrodes are on ends of the chip opposite to each other, and each of the first and second chip electrodes has a plurality of electrode parts.

4. An electronic circuit apparatus according to claim 1 in which each of the first and second pad electrodes has a rectangular shape, as projected onto the main surface of the substrate and each of the first and second chip electrodes has a rectangular shape, as projected onto the surface of the chip.

5. An electronic circuit apparatus according to claim 1 in which the first interval is defined as a minimum interval between a first line segment indicating a maximum width of the first pad electrode and a second line segment indicating a maximum width of the second pad electrode, and the second interval is defined as a minimum interval between an inside end of the first chip electrode and an inside end of the second chip electrode.

6. An electronic circuit apparatus according to claim 5 in which a tip of each of the first and second pad electrodes facing each other has a circular shape.

7. An electronic circuit apparatus according to claim 5 in which the first pad electrode has a projecting portion facing the second pad electrode, the second pad electrode has a projecting portion facing the first pad electrode, and the projecting portions of the first and second pad electrodes respectively have a triangular shape.

8. An electronic circuit apparatus according to claim 5 in which the first pad electrode has a projecting portion facing the second pad electrode, the second pad electrode has a projecting portion facing the first pad electrode, and the projecting portions of the first and second pad electrodes respectively have a shape defined by an arc of a circle.

9. An electronic circuit apparatus according to claim 5 in which tips of each of the first and second pad electrodes facing each other has an oval shape.

10. An electronic circuit apparatus according to claim 1 in which each of the pad electrodes has a portion whose width continuously decreases from a first width at a first position on each of the pad electrodes to a second width at a second position on each of the pad electrodes, wherein said first positions on each of the pad electrodes are positioned inside of the second positions on each of the pad electrodes.

11. An electronic circuit apparatus according to claim 10 in which each of the first and second pad electrodes has a symmetrical shape with five sides, with a first side joining a second side at a right angle, a third side joining the second side at a right angle, a fourth side joining a third side at an obtuse angle, a fifth side joining the fourth side and the fifth side joining the first at an obtuse angle, wherein an axis of symmetry passes through an endpoint of the fourth and fifth sides and through the second side.

12. An electronic circuit apparatus according to claim 1, wherein outer edges of the first and second chip electrodes are positioned over the first and second pad electrodes, respectively.

13. An electronic circuit apparatus according to claim 12, wherein outer edges of the first and second chip electrodes are aligned with edges of the chip.

14. An electronic circuit apparatus according to claim 13, wherein the chip consists of a circuit selected from the group including capacitor and resistor.

15. An electronic circuit apparatus according to claim 12, wherein outer edges of the first and second chip electrodes extend along vertical surfaces of the chip and the first and second solders are in contact with the vertical surfaces of the chip.

16. An electronic circuit apparatus according to claim 15, wherein the first and second solders are in contact with faces of the first and second pad electrodes, respectively.

17. An electronic circuit apparatus according to claim 1, wherein the first and second solders each extend along inner edges of the first and second pad electrodes, respectively.

18. An electronic circuit apparatus according to claim 17, wherein the first and second solders each extend along inner edges of the first and second chip electrodes, respectively.

19. An electronic circuit apparatus according to claim 1, wherein the inner edges of the first and second chip electrodes are both spaced from the inner edges of the first and second pad electrodes by an equal distance.

20. An electronic circuit apparatus according to claim 19, wherein the first solder and the second solder extend between inner edges of the first and second chip electrodes and the first and second pad electrodes, respectively.

* * * * *